(12) United States Patent
Huang et al.

(10) Patent No.: US 11,996,835 B2
(45) Date of Patent: May 28, 2024

(54) DARLINGTON TRANSISTOR DRIVE CIRCUIT, METHOD AND SWITCHING POWER SUPPLY MANAGEMENT CHIP

(71) Applicant: Fremont Micro Devices Corporation, Guangdong (CN)

(72) Inventors: Yuquan Huang, Guangdong (CN); Chong Huang, Guangdong (CN); Kelvin Yupak Hui, Guangdong (CN)

(73) Assignee: Fremont Micro Devices Corporation, Shenzhen (CN)

( * ) Notice: Subject to any disclaimer, the term of this patent is extended or adjusted under 35 U.S.C. 154(b) by 0 days.

(21) Appl. No.: 18/169,869

(22) Filed: Feb. 15, 2023

(65) Prior Publication Data

US 2023/0299766 A1    Sep. 21, 2023

(30) Foreign Application Priority Data

Mar. 21, 2022   (CN) .......................... 202210286095.2

(51) Int. Cl.
  *H03K 17/615*   (2006.01)
  *H03K 17/0412*  (2006.01)
  *H03K 17/567*   (2006.01)
  *H03K 17/60*    (2006.01)

(52) U.S. Cl.
  CPC ..... *H03K 17/615* (2013.01); *H03K 17/04126* (2013.01); *H03K 17/567* (2013.01); *H03K 17/601* (2013.01); *H03K 2217/0036* (2013.01)

(58) Field of Classification Search
  CPC .......... H03K 17/615; H03K 17/04126; H03K 17/567; H03K 17/601
  See application file for complete search history.

(56) References Cited

U.S. PATENT DOCUMENTS

| 4,359,652 A | * | 11/1982 | Jarrett | F02P 3/0453 |
| | | | | 315/209 T |
| 2019/0081034 A1 | * | 3/2019 | Chaudhry | H02H 9/046 |
| 2023/0299607 A1 | * | 9/2023 | Yang | H02M 3/33569 |
| | | | | 363/21.01 |

* cited by examiner

*Primary Examiner* — Thomas J. Hiltunen
*Assistant Examiner* — Khareem E Almo

(57) ABSTRACT

Disclosed by present disclosure are a Darlington transistor drive circuit, a Darlington transistor drive method and a switching power supply management chip. In this embodiment, the Darlington transistor is driven sectionally. At the beginning of the switching-on cycle, the driving of the primary transistor is not started temporarily, instead the drive source is used to drive the secondary transistor. After the secondary transistor is completely switched on, the drive source of the secondary transistor is switched off and the drive source of the primary transistor is switched on to drive the Darlington transistor. The primary and secondary transistor have been completely switched on, and the drive current of the secondary transistor never depend on the primary transistor, so the voltage at the input terminal of the secondary transistor can be smaller than the voltage at the control terminal of the secondary transistor. Such that the switching-on power loss is reduced.

19 Claims, 5 Drawing Sheets

DARLINGTON TRANSISTOR DRIVE CIRCUIT, METHOD AND SWITCHING POWER SUPPLY MANAGEMENT CHIP

CROSS REFERENCE TO RELATED APPLICATIONS

The present application claims the benefit of Chinese Patent Application No. 202210286095.2 filed on Mar. 21, 2022, the contents of which are incorporated herein by reference in their entirety.

TECHNICAL FIELD

The present disclosure relates generally to a power supply technical field, and more particularly relates to a Darlington transistor drive circuit, a Darlington transistor drive method, and a switching power supply management chip.

BACKGROUND

FIG. 1 has shown an existing Darlington transistor drive circuit, which mainly includes a control module, three control MOS tubes M1, M2, M3 and two drive pins Q1B and Q2B. The control MOS tube M1 is used as a switch. When the control module sends a switching-on instruction to the control MOS tube M1. The control MOS tube M1 is switched on while the control MOS tubes M2 and M3 are switched off. The base current Ibase flows to the Darlington transistor through the drive pin Q1B, such that the Darlington transistor is switched on, and the voltage at the node CS increases accordingly. When the voltage at the node CS reaches a voltage value Ref1, the control MOS tube M1 is switched off, and the current Ibase fails to flow to the Darlington transistor. When the voltage at the node CS reaches a voltage value Ref2, the control module sends a switching-off instruction to switch on the control MOS tubes M2 and M3, such that the voltages at the drive pins Q1B and Q2B are drawn down to the ground GND.

One limitation of the existing drive methods is that the base current Ibase of the secondary transistor Q2 of the Darlington transistor is from the collector (C electrode) of the primary transistor Q1 of the Darlington transistor. Therefore, after the Darlington transistor is switched on, the collector-emitter voltage Vce of the Darlington transistor should be larger than the base-emitter voltage Vbe of Darlington transistor (which is generally 0.65 v), as shown in FIG. 2. But when the collector-emitter voltage Vce is larger than 0.65 v, a large switching-on power loss presents.

SUMMARY

The present disclosure has provided a Darlington transistor drive circuit, a Darlington transistor drive method, and a switching power supply management chip, aiming at the above-mentioned defect that a large switching-on power loss presents when the Darlington transistor is switched on.

According to a first aspect, a Darlington transistor drive circuit is provided, wherein the Darlington transistor drive circuit is configured to drive a Darlington transistor which includes a primary transistor and a secondary transistor, to operate alternately in a switching-on cycle and a switching-off cycle; wherein the Darlington transistor drive circuit specifically includes:

a first drive source, which is connected with a control terminal of the primary transistor and is configured to provide a drive current to the primary transistor;

a second drive source, which is connected with a control terminal of the secondary transistor and is configured to provide a drive current to the secondary transistor;

a control module, which is respectively connected with the first drive source and the second drive source, and is configured to synchronously control the second drive source to start driving the secondary transistor at a beginning of each switching-on cycle, to control the first drive source to start driving the primary transistor after the secondary transistor is completely switched on, and to control the second drive source to stop driving the secondary transistor at a same time when controlling the first drive source to start driving the primary transistor, and to control the first drive source to stop driving the primary transistor when a current switching-on cycle needs to be ended.

Preferably, the Darlington transistor drive circuit further includes a sampling detection circuit, which is respectively connected with an output terminal of the secondary transistor and the control module; wherein the sampling detection circuit is configured to detect a sampled voltage which is generated by an output current of the secondary transistor and to feed back the sampled voltage to the control module; wherein the control module is further configured to, in each switching-on cycle:

firstly control the second drive source to start driving the secondary transistor; synchronously control the first drive source to start driving the primary transistor and control the second drive source to stop driving the secondary transistor, when the sampled voltage increases to a first reference voltage; determine to end the current switching-on cycle when the sampled voltage increases to a second reference voltage, and control the first drive source to stop driving the primary transistor.

Preferably, the Darlington transistor drive circuit further includes:

a first discharge circuit, which is connected with the control terminal of the primary transistor and is configured to discharge the control terminal of the primary transistor to completely switch off the primary transistor; and a second discharge circuit, which is connected with the control terminal of the secondary transistor and is configured to discharge the control terminal of the secondary transistor to completely switch off the secondary transistor;

wherein the control module is further configured to, in each switching-on cycle: synchronously control the first discharge circuit and the second discharge circuit to stop discharge when controlling the second drive source to start driving the secondary transistor; and synchronously control the first discharge circuit and the second discharge circuit to start discharge when the sampled voltage increases to a third reference voltage, wherein the third reference voltage is larger than the second reference voltage.

Preferably, the first reference voltage is equivalent to 20% to 50% of the third reference voltage.

Preferably, the first discharge circuit includes a first discharge switch, the second discharge circuit includes a second discharge switch, wherein the first discharge switch is connected between the control terminal of the primary transistor and ground, the second discharge switch is connected between the control terminal of the secondary transistor and the ground, and control terminals of the first discharge switch and the second discharge switch are connected with the control module.

Preferably, the first drive source includes a first power supply and a first drive switch, the second drive source includes a second power supply and a second drive switch, wherein the first drive switch is connected between the first power supply and the control terminal of the primary transistor, and the second drive switch is connected between the second power supply and the control terminal of the secondary transistor, control terminals of the first drive switch and the second drive switch are respectively connected with the control module.

Preferably, the first drive switch and the second drive switch are MOS tubes.

Preferably, the first discharge switch and the second discharge switch are MOS tubes.

According to a second aspect, a switching power supply management chip is provided, which includes a Darlington transistor drive circuit, wherein the Darlington transistor drive circuit is configured to drive a Darlington transistor, which includes a primary transistor and a secondary transistor, to operate alternately in a switching-on cycle and a switching-off cycle; wherein the Darlington transistor drive circuit specifically includes:
- a first drive source, which is connected with a control terminal of the primary transistor and is configured to provide a drive current to the primary transistor;
- a second drive source, which is connected with a control terminal of the secondary transistor and is configured to provide a drive current to the secondary transistor;
- a control module, which is respectively connected with the first drive source and the second drive source, and is configured to synchronously control the second drive source to start driving the secondary transistor at a beginning of each switching-on cycle, to control the first drive source to start driving the primary transistor after the secondary transistor is completely switched on, and to control the second drive source to stop driving the secondary transistor at a same time when controlling the first drive source to start driving the primary transistor, and to control the first drive source to stop driving the primary transistor when a current switching-on cycle needs to be ended.

Preferably, the Darlington transistor drive circuit further includes a sampling detection circuit, which is respectively connected with an output terminal of the secondary transistor and the control module; wherein the sampling detection circuit is configured to detect a sampled voltage which is generated by an output current of the secondary transistor and to feed back the sampled voltage to the control module;

wherein the control module is further configured to, in each switching-on cycle:
firstly control the second drive source to start driving the secondary transistor; synchronously control the first drive source to start driving the primary transistor and control the second drive source to stop driving the secondary transistor, when the sampled voltage increases to a first reference voltage; determine to end the current switching-on cycle when the sampled voltage increases to a second reference voltage, and control the first drive source to stop driving the primary transistor.

Preferably, the Darlington transistor drive circuit further includes:
a first discharge circuit, which is connected with the control terminal of the primary transistor and is configured to discharge the control terminal of the primary transistor to completely switch off the primary transistor; and a second discharge circuit, which is connected with the control terminal of the secondary transistor and is configured to discharge the control terminal of the secondary transistor to completely switch off the secondary transistor;

wherein the control module is further configured to, in each switching-on cycle:
synchronously control the first discharge circuit and the second discharge circuit to stop discharge when controlling the second drive source to start driving the secondary transistor; and synchronously control the first discharge circuit and the second discharge circuit to start discharge when the sampled voltage increases to a third reference voltage, wherein the third reference voltage is larger than the second reference voltage.

Preferably, the first reference voltage is equivalent to 20% to 50% of the third reference voltage.

Preferably, the first discharge circuit includes a first discharge switch, the second discharge circuit includes a second discharge switch, wherein the first discharge switch is connected between the control terminal of the primary transistor and ground, the second discharge switch is connected between the control terminal of the secondary transistor and the ground, and control terminals of the first discharge switch and the second discharge switch are connected with the control module.

Preferably, the first drive source includes a first power supply and a first drive switch, the second drive source includes a second power supply and a second drive switch, wherein the first drive switch is connected between the first power supply and the control terminal of the primary transistor, and the second drive switch is connected between the second power supply and the control terminal of the secondary transistor, control terminals of the first drive switch and the second drive switch are respectively connected with the control module.

Preferably, the first drive switch and the second drive switch are MOS tubes.

Preferably, the first discharge switch and the second discharge switch are MOS tubes.

According to a third aspect, a Darlington transistor drive method is provided, wherein the Darlington transistor drive method is applied to a Darlington transistor which includes a primary transistor and a secondary transistor; wherein the Darlington transistor drive method specifically includes:
- synchronously controlling a second drive source to start driving the secondary transistor at a beginning of each switching-on cycle;
- controlling a first drive source to start driving the primary transistor after the secondary transistor is completely switched on, and controlling the second drive source to stop driving the secondary transistor at a same time when controlling the first drive source to start driving the primary transistor;
- controlling the first drive source to stop driving the primary transistor when a current switching-on cycle needs to be ended.

Preferably, the method specifically includes, in each switching-on cycle:
controlling a first discharge circuit and a second discharge circuit to stop discharge, and synchronously controlling the second drive source to start driving the secondary transistor;
synchronously control the first drive source to start driving the primary transistor and control the second drive source to stop driving the secondary transistor, when a sampled voltage increases to a first reference voltage;
determining to end the current switching-on cycle when the sampled voltage increases to a second reference voltage, and controlling the first drive source to stop driving the primary transistor;

controlling the first discharge circuit and the second discharge circuit to start discharge when the sampled voltage increases to a third reference voltage.

Preferably, the first reference voltage is equivalent to 20% to 50% of the third reference voltage.

The Darlington transistor drive circuit, Darlington transistor drive method, and switching power supply management chip of the present disclosure has following technical effects. In this embodiment, the Darlington transistor is driven sectionally. At the beginning of the switching-on cycle, the driving of the primary transistor is not started temporarily, instead the drive source is directly used to drive the secondary transistor. After the secondary transistor is completely switched on, the drive source of the secondary transistor is switched off and the drive source of the primary transistor is switched on to drive the whole Darlington transistor, because the primary transistor and the secondary transistor have been completely switched on, and the drive current of the secondary transistor does not depend on the primary transistor, so the voltage at the input terminal of the secondary transistor can be smaller than the voltage at the control terminal of the secondary transistor, so the voltage drop between the input terminal and the output terminal, when the secondary transistor is switched on, does not need to be larger than the base-emitter voltage of the secondary transistor when the secondary transistor is switched on. In such a way, the power loss is reduced when the Darlington transistor is switched on.

BRIEF DESCRIPTION OF THE DRAWINGS

In order to illustrate the embodiments of the present disclosure or the technical solutions in the prior art more clearly, the drawings needed in the description of the embodiments or the prior art will be briefly introduced. It is obvious that the drawings in the following description are only the embodiments of the present disclosure, and for one skilled in the art, other drawings can be obtained from the following attached drawings without paying creative labor.

DETAILED DESCRIPTION OF THE PREFERRED EMBODIMENT

Figure 1:
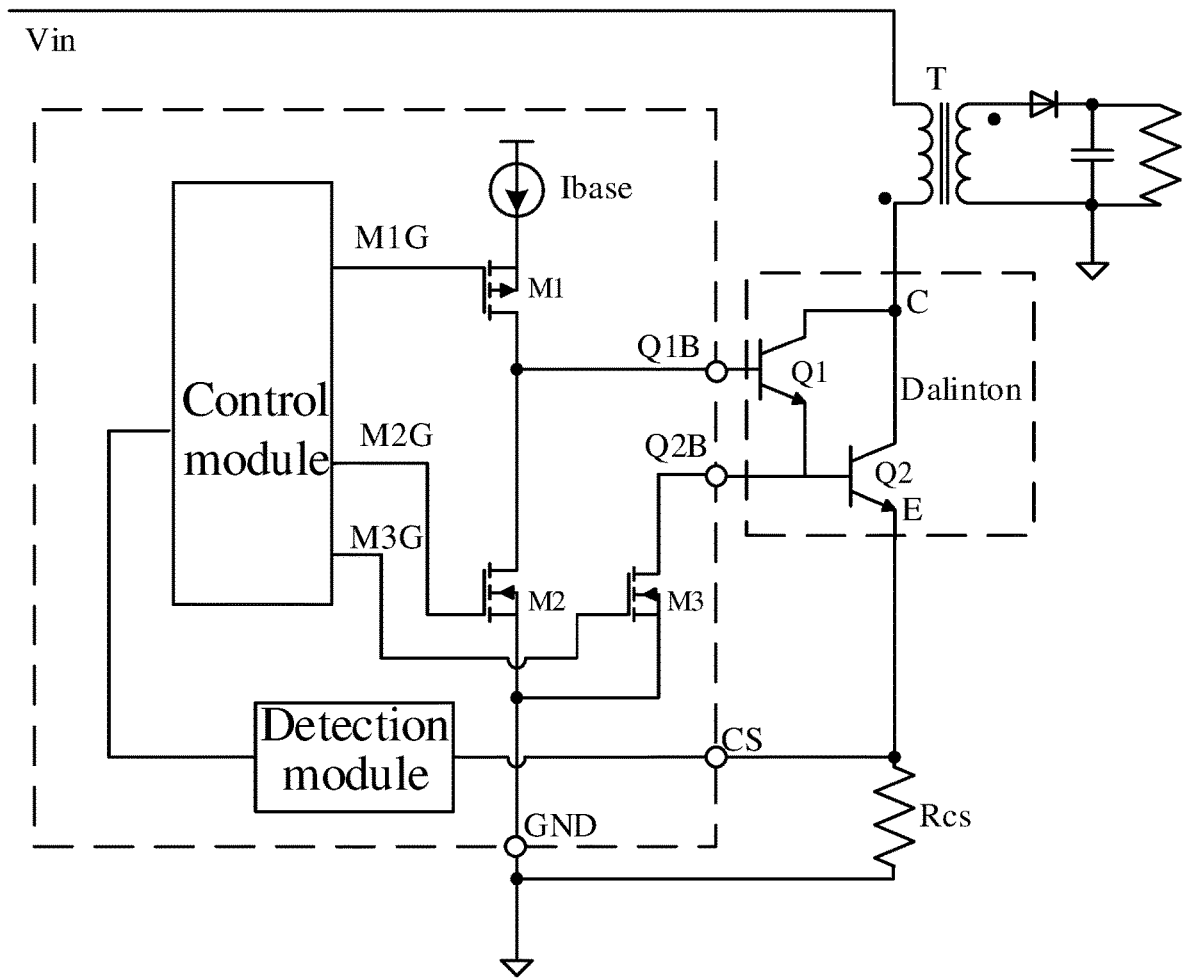
FIG. 1 is a schematic diagram of a prior Darlington transistor flyback power supply.
Figure 2:
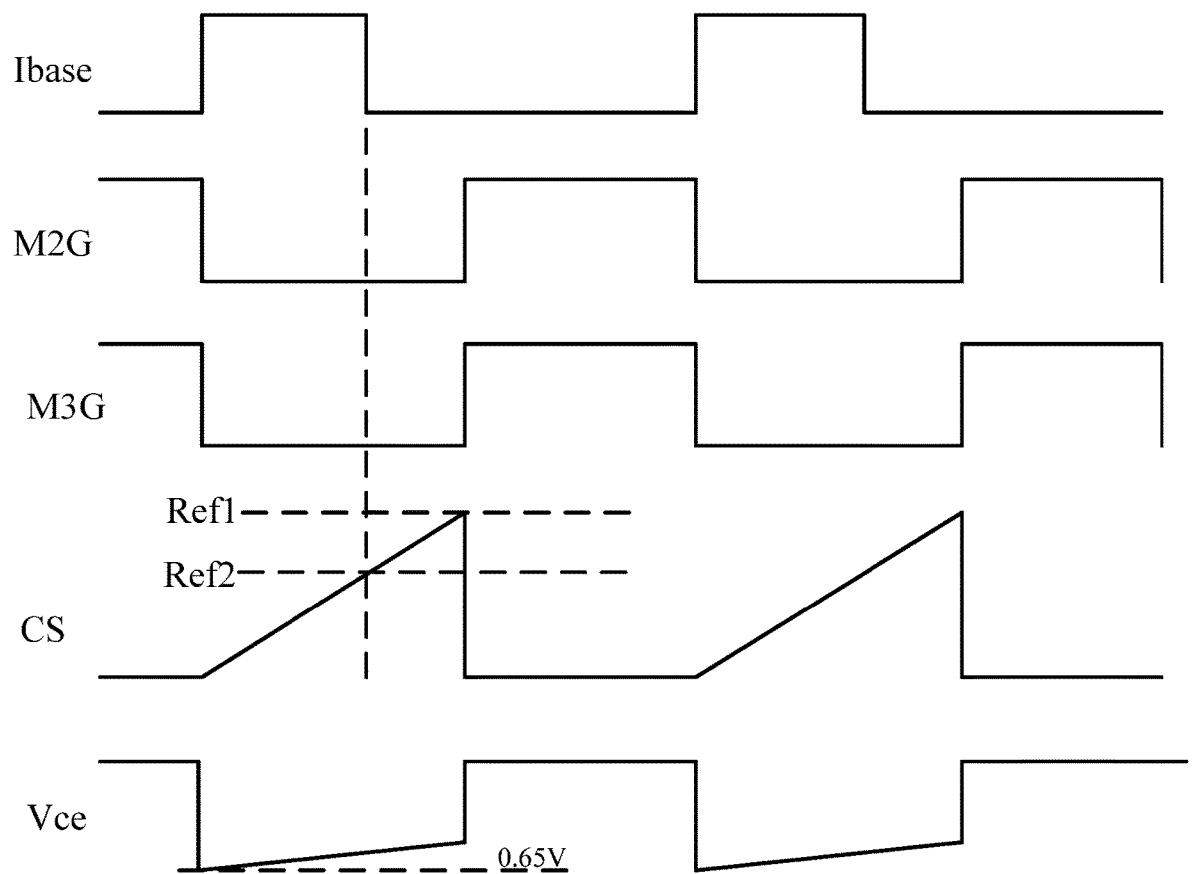
FIG. 2 is an operation waveform diagram of the circuit shown in FIG. 1.

In order to facilitate the understanding of the present disclosure, a more comprehensive description of the present disclosure will be given as follows with reference to the relevant drawings. Typical embodiments of the present disclosure are shown in the drawings. However, the present disclosure can be implemented in many different forms and is not limited to the embodiments described herein. On the contrary, the purpose of providing these embodiments is to make the description of the present disclosure more thorough and comprehensive.

Unless otherwise defined, all technical and scientific terms used herein have the same meanings as those commonly understood by one skilled in the art of the present disclosure. The terms used in the description of the present disclosure are only for the purpose of describing specific embodiments, and are not intended to limit the present disclosure.

The terms "first", "second" and other ordinal numbers used in this specification can be used to describe but not limit the various constituent elements. The purpose of using these terms is to distinguish one constituent element from the other. For example, without departing from the scope of the present disclosure, the first constituent element can be named as the second constituent element, and similarly, the second constituent element can also be named as the first constituent element. The "connect with" or "connect to" mentioned herein not only includes the direct connection of two entities, but also includes the indirect connection through other entities with beneficial improvement effect. The terms "equal to", "equivalent to", "at the same time", "synchronous" or other similar terms are not limited to absolute equal or identical in mathematical terms. When implementing the embodiments described in this disclosure, they can be similar in engineering sense or within acceptable error range.

In order to solve the problem of large switching-on power loss when the Darlington transistor is switched on, the present disclosure has provided a Darlington transistor drive circuit, a Darlington transistor drive method, and a switching power supply management chip. The Darlington transistor drive circuit of this disclosure includes two drive sources which are respectively connected with control terminals of a primary transistor and a secondary transistor of the Darlington transistor. The two drive sources are used to drive the Darlington transistor sectionally. At the beginning of the switching-on cycle, the driving of the primary transistor is not started temporarily, instead the drive source is directly used to drive the secondary transistor. After the secondary transistor is completely switched on, the drive source of the secondary transistor is switched off and the drive source of the primary transistor is switched on to drive the whole Darlington transistor, because the primary transistor and the secondary transistor have been completely switched on, and the drive current of the secondary transistor does not depend on the primary transistor, so the voltage at the input terminal of the secondary transistor can be smaller than the voltage at the control terminal of the secondary transistor, so the voltage drop between the input terminal and the output terminal, when the secondary transistor is switched on, does not need to be larger than the base-emitter voltage of the secondary transistor, when the secondary transistor is switched on. In such a way, the power loss is reduced when the Darlington transistor is switched on.

In order to better understand the above technical scheme, the above technical scheme will be described in detail in combination with the drawings of the specification and the specific embodiments. It should be understood that the embodiment of the present disclosure and the specific features in the embodiment are the detailed description of the technical scheme of the present disclosure, not the limitation of the technical scheme of the present disclosure. In the case of no conflict, the embodiment of the present disclosure and the technical features in the embodiment can be combined with each other.

Figure 3:
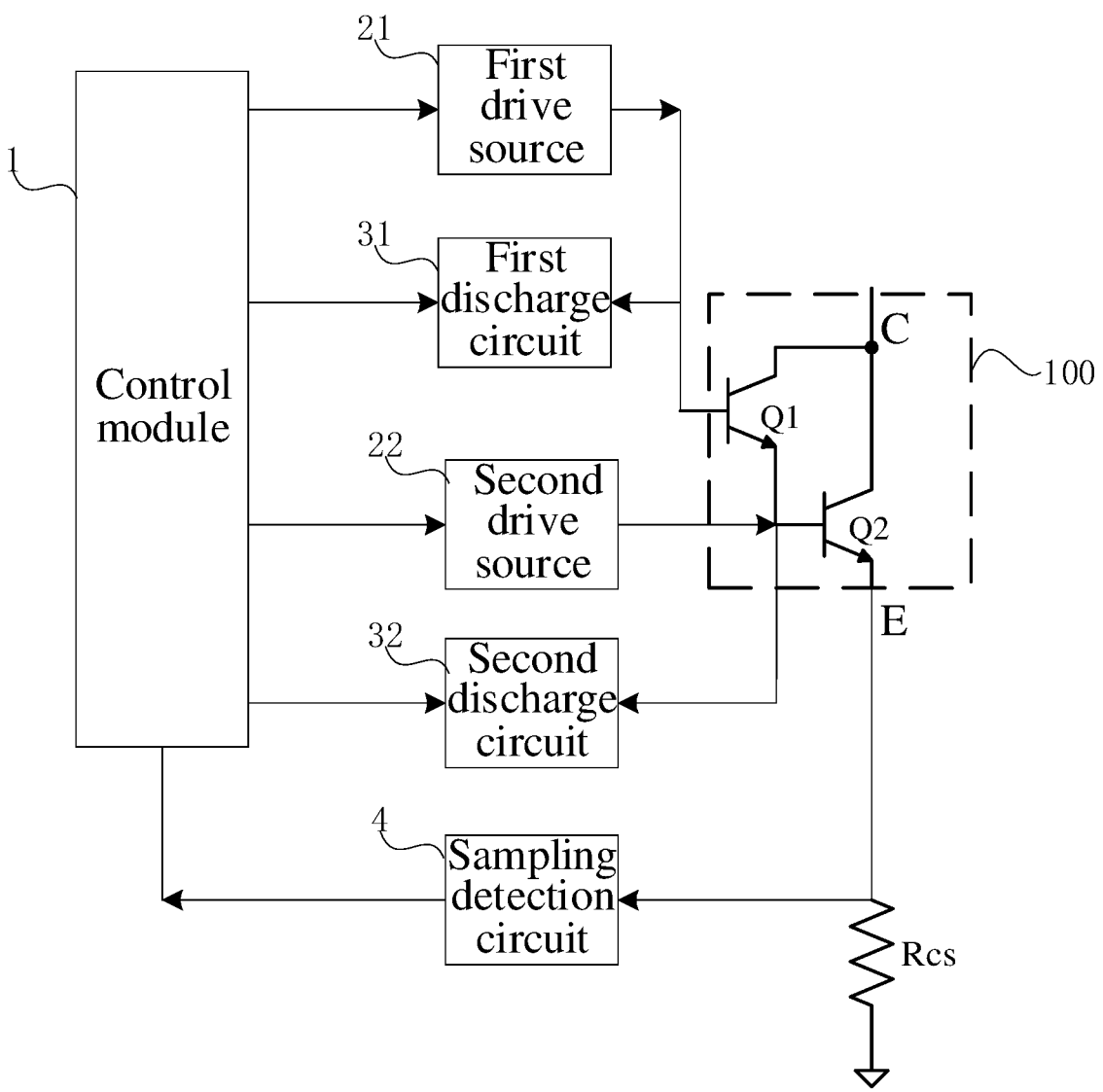
FIG. 3 is a circuit diagram of a Darlington transistor drive circuit according to an embodiment of the present disclosure.

Referring FIG. 3, the Darlington transistor 100 includes a primary transistor Q1 and a secondary transistor Q2. The Darlington transistor drive circuit is configured to drive the Darlington transistor 100 to operate alternately in a switching-on cycle and a switching-off cycle. The Darlington transistor drive circuit specifically includes a first drive source 21, a second drive source 22 and a control module 1. The first drive source 21 is connected with a control terminal of the primary transistor Q1 and is configured to provide a drive current to the primary transistor Q1. The second drive source 22 is connected with a control terminal of the secondary transistor Q2 and is configured to provide a drive current to the secondary transistor Q2. The control module 1 is respectively connected with the first drive source 21 and the second drive source 22. The control module 1 is configured to synchronously control the second drive source 22 to start driving the secondary transistor Q2 at a beginning of each switching-on cycle, to control the first drive source 21 to start driving the primary transistor Q1 after the secondary transistor Q2 is completely switched on, and to control the second drive source 22 to stop driving the secondary transistor Q2 at a same time when controlling the first drive source 21 to start driving the primary transistor Q1, and to control the first drive source 21 to stop driving the primary transistor Q1 when a current switching-on cycle needs to be ended.

Theoretically, the control module 1 can control the operation time of the first drive source 21 and the second drive source 22 through timing, because the Darlington transistor drive circuit is finally applied to a specific scene, such as switching power supply management chip. The output of the secondary transistor Q2 in the switching power supply management chip is grounded through a sampling resistor Rcs, and the switching power supply management chip will control the operation cycle of the Darlington transistor 100, in combination with the sampled voltage of the sampling resistor Rcs. Therefore, combined with the switching control characteristics of the switch tube in the switching power supply management chip, the control module 1 uses the sampled voltage, which is fed back to, control the operation time of the first drive source 21 and the second drive source 22, in the Darlington transistor drive circuit of this disclosure.

Therefore, it is preferred that the Darlington transistor drive circuit of this disclosure further includes a sampling detection circuit 4, which is respectively connected with an output terminal of the secondary transistor Q2 and the control module 1. The sampling detection circuit 4 is configured to detect a sampled voltage which is generated by an output current of the secondary transistor Q2 and to feed back the sampled voltage to the control module 1.

Correspondingly, the control module 1 is specifically configured to, in each switching-on cycle: firstly control the second drive source 22 to start driving the secondary transistor Q2; synchronously control the first drive source 21 to start driving the primary transistor Q1 and control the second drive source 22 to stop driving the secondary transistor Q2, when the sampled voltage increases to a first reference voltage Ref1; determine to end the current switching-on cycle when the sampled voltage increases to a second reference voltage Ref1; and control the first drive source 21 to stop driving the primary transistor Q1. Wherein the second reference voltage Ref1 is larger than the first reference voltage Ref1.

Because when the driving of the Darlington transistor 100 is withdrawn or cut off, the Darlington transistor 100 is not switched off immediately, but continues to being in a conduction state for a period of time. At this time, the current flowing through the Darlington transistor 100 continues increasing. In order to limit the current flowing through the Darlington transistor 100, the Darlington transistor drive circuit according to a further preferable embodiment of this disclosure further includes a first discharge circuit 31 and a second discharge circuit 32. The first discharge circuit is connected with the control terminal of the primary transistor Q1 and is configured to discharge the control terminal of the primary transistor Q1 to completely switch off the primary transistor Q1. The second discharge circuit 32 is connected with the control terminal of the secondary transistor Q2 and is configured to discharge the control terminal of the secondary transistor Q2 to completely switch off the secondary transistor Q2.

Correspondingly, the control module 1 is specifically configured to, in each switching-on cycle: synchronously control the first discharge circuit 31 and the second discharge circuit 32 to stop discharge when controlling the second drive source 22 to start driving the secondary transistor Q2; and synchronously control the first discharge circuit 31 and the second discharge circuit 32 to start discharge until the next switching-on cycle, when the sampled voltage increases to a third reference voltage. That is, during the switching-off cycle, the first discharge circuit 31 and the second discharge circuit 32 both operate at the discharge state. Wherein the third reference voltage Ref2 is larger than the second reference voltage Re1l.

In an embodiment of this disclosure, the control module 1 can be implemented using one or more microprocessors, micro-controllers, digital signal processors, microcomputers, central processing units, field programmable gate arrays, programmable logic devices, state machines, logic circuits, analog circuits, digital circuits, and/or any devices that manipulates signals (analog and/or digital) based on operational instructions that are stored in a memory module.

In a further preferable embodiment, the sampling detection circuit 4 of this disclosure can be realized by PWM (Pulse-Width Modulation) comparator. For example, because the sampled voltage in this disclosure is compared with three reference voltages (the first reference voltage Ref0, the second reference voltage Re1l and the third reference voltage Ref2), three PWM comparators can be designed. First input terminals of the three PWM comparators are connected with the output terminal of the secondary transistor Q2, second input terminals of the three PWM comparators are respectively connected with connected with the first reference voltage Ref0, the second reference voltage Ref1 and the third reference voltage Ref2, and output terminals of the three PWM comparators are connected with the control module 1. The control module 1 can determine whether the sampled voltage increase to the corresponding reference voltage according to whether the output signals of the three PWM comparators are turned over.

Preferably, the first reference voltage Ref0 is equivalent to 20% to 50% of the third reference voltage Ref2, which can be determined according to the NPN characteristics of the actual Darlington transistor 100.

The application of the Darlington transistor drive circuit can be applied to any suitable circuits, such as a switching power management chip. The switching power management chip 200 is described in detail below.

The switching power management chip 200 provides a grounded pin GND, a sampling pin CS, two drive pins Q1B and Q2B. The switching power management chip 200 is externally connected with a Darlington transistor 100 and a sampling resistor Rcs. The sampling resistor Rcs is connected between the sampling pin CS and the grounded pin GND. The Darlington transistor 100 includes a primary transistor Q1 and a secondary transistor Q2. The switching power management chip 200 includes a Darlington transistor drive circuit which is configured to drive the Darlington transistor 100 to operate alternately in a switching-on cycle and a switching-off cycle. The Darlington transistor drive circuit specifically includes a first drive source 21, a sampling detection circuit 4, a second drive source 22, a control module 1, a first discharge circuit 31 and a second discharge circuit 32.

The control terminal of the primary transistor Q1 of the Darlington transistor 100 is connected with the drive pin Q1B, and the control terminal of the secondary transistor Q2 is connected with the drive pin Q2B. The input terminal of Darlington transistor 100, that is, the input terminal of secondary transistor Q2, is connected with an external input power supply Vin through a primary side of a transformer T. Wherein the external input power supply Vin can be DC or AC external input power supply. The output terminal of Darlington transistor 100, that is, the output terminal of secondary transistor Q2, is connected with the sampling pin CS.

Figure 4:
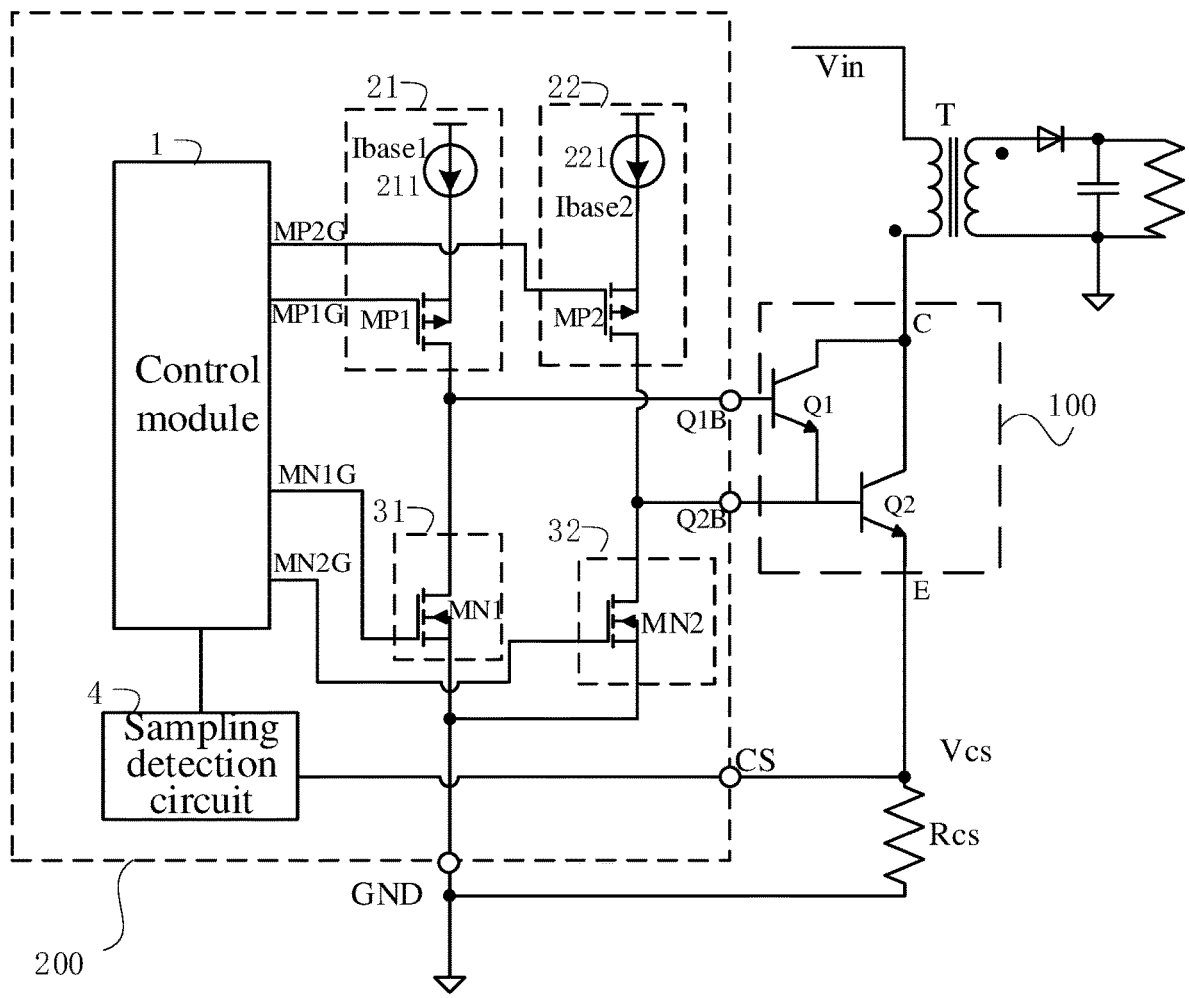
FIG. 4 is a schematic diagram of a switching power supply management chip integrating a Darlington transistor drive circuit, according to an embodiment of the present disclosure.

Specifically, as show in FIG. 4, the first discharge circuit 31 includes a first discharge switch MN1, the second discharge circuit 32 includes a second discharge switch MN2. Preferably, the first drive source 21 includes a first power supply 211 which outputs drive current Ibas1 and a first drive switch MP1, the second drive source 22 includes a second power supply 221 which outputs drive current Ibas2 and a second drive switch MP2. In this embodiment, the first discharge switch MN1 and the second discharge switch MN2 are both switch tubes, especially MOS tube. Similarly, the first drive switch MP1 and the second drive switch MP2 are both switch tubes, especially MOS tube.

The first discharge switch MN1 is connected between the control terminal of the primary transistor Q1 (which is also the drive pin Q1B) and ground, the second discharge switch MN2 is connected between the control terminal of the secondary transistor Q2 (which is also the drive pin Q2B) and the ground, and control terminals of the first discharge switch MN1 and the second discharge switch MN2 are connected with the control module 1. The first drive switch MP1 is connected between the first power supply 211 and the control terminal of the primary transistor Q1 (which is also the drive pin Q1B), and the second drive switch MP2 is connected between the second power supply 221 and the control terminal of the secondary transistor Q2 (which is also the drive pin Q2B), control terminals of the first drive switch MP1 and the second drive switch MP2 are respectively connected with the control module 1.

Combining FIGS. 4-5, the operation principle of the embodiment of this disclosure is described as follows.

Figure 5:
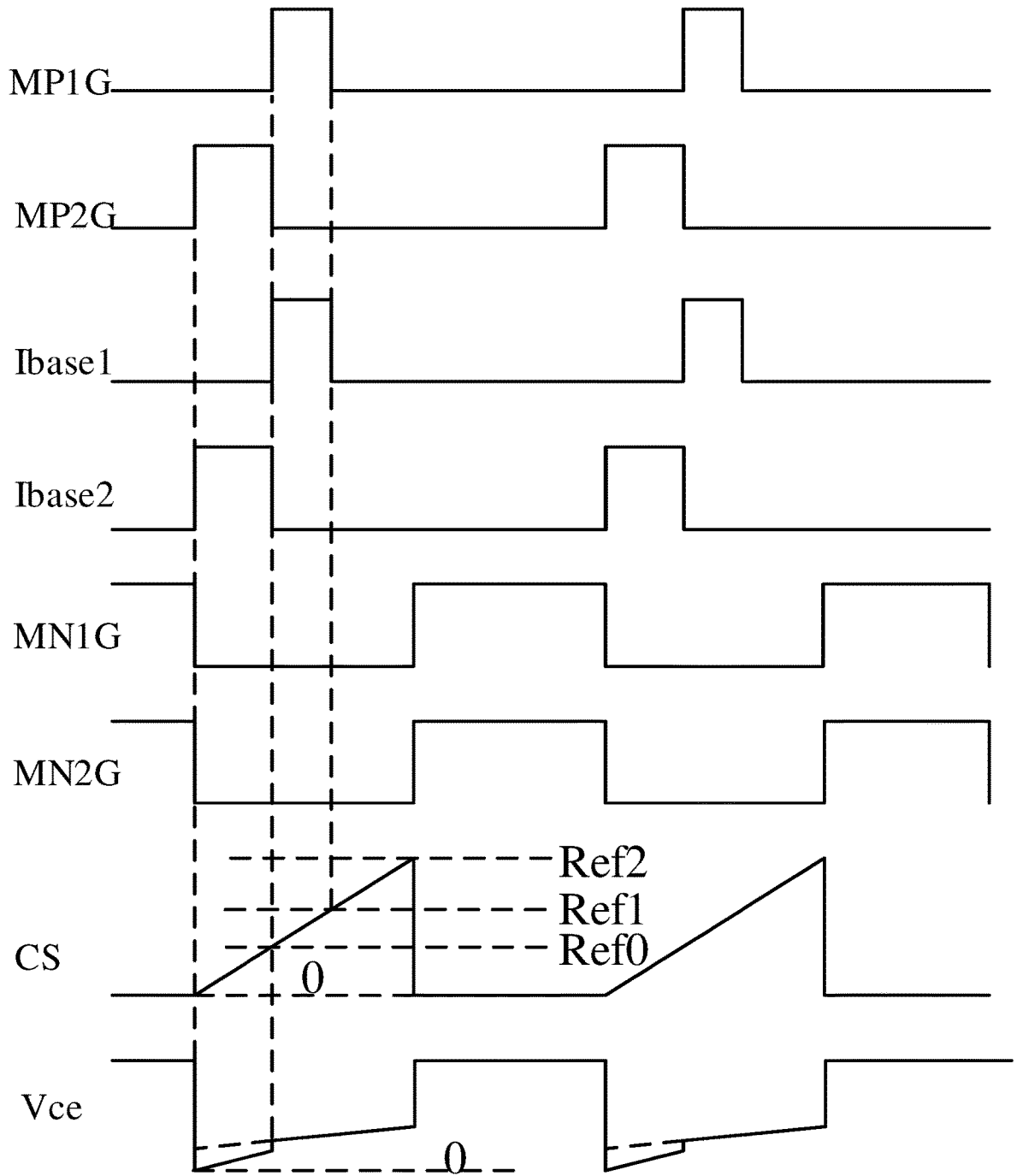
FIG. 5 is an operation waveform diagram of the circuit shown in FIG. 4.

As shown in FIG. 5, when the control module 1 sends out a switching-on instruction, the control module 1 turns over signals MP2G, MN1G, MN2G while maintains signal MP1G, such that, just the second drive switch MP2 of the second drive source 22 starts to be switched on, while the first drive switch MP1 and the second drive switch MP2 of the first discharge circuit 31 and the second discharge circuit 32 start to be switched off, and the first drive switch MP1 of the first drive source 21 remains to be switched off. At this time, the drive current Ibase2 of the second drive source 22 flows to the secondary transistor Q2 of the Darlington transistor 100 through the drive pin Q2B, and the secondary transistor Q2 is switched on, and the sampled voltage Vcs increases.

When the sampled voltage Vcs increases to the first reference voltage Ref0, signals MP2G, MP1G turn over. Accordingly, the first drive switch MP1 of the first drive source 21 is switched on, while the second drive switch MP2 of the second discharge circuit 32 is switched off, and the drive current Ibase2 of the second drive source 22 is cut off. The drive current Ibase1 of the first drive source 21 flows to the primary transistor Q1 of Darlington transistor 100 through drive pin Q1b, and then into the collector C of the secondary transistor Q2 after being amplified by the primary transistor Q1.

When the sampled voltage Vcs increases to the second reference voltage Ref1, signal MP turns over, such that the first drive switch MP1 of the first drive source 21 is switched off, and the drive current Ibase1 and drive current Ibase2 cannot flow into the Darlington transistor 100.

When the sampled voltage Vcs increases to the third reference voltage Ref2, signals MN1G, MN2G turn over, such that the first discharge switch MN1 and the second discharge switch MN2 of the first discharge circuit 31 and the second discharge circuit 32 are switched on, and the voltages at the drive pins Q1B and Q2B are drawn down to the ground GND.

Since the base current does not depend on the primary transistor Q1 when the secondary transistor Q2 is switched on, the collector voltage VC can be smaller than the collector-emitter voltage Vce of the Darlington transistor, that is, the collector-emitter voltage Vce of the Darlington transistor should not be larger than the base-emitter voltage Vbe of Darlington transistor, which reduces the power loss when the Darlington transistor is switched on. Referring FIG. 5, the collector-emitter voltage Vce can be larger than or equal to zero, rather than should be larger than 0.65 v as that in the prior art.

Based on the same inventive concept, the present disclosure has further requested to protect a Darlington transistor drive method which is applied to a Darlington transistor which includes a primary transistor Q1 and a secondary transistor Q2; wherein the Darlington transistor drive method specifically includes synchronously controlling a second drive source 22 to start driving the secondary transistor Q2 at a beginning of each switching-on cycle; controlling a first drive source 21 to start driving the primary transistor Q1 after the secondary transistor Q2 is completely switched on, and controlling the second drive source 22 to stop driving the secondary transistor Q2 at a same time when controlling the first drive source 21 to start driving the primary transistor Q1; and controlling the first drive source 21 to stop driving the primary transistor Q1 when a current switching-on cycle needs to be ended.

Preferably, the method specifically includes, in each switching-on cycle: controlling a first discharge circuit 31 and a second discharge circuit 32 to stop discharge, and synchronously controlling the second drive source 22 to start driving the secondary transistor Q2;

synchronously control the first drive source 21 to start driving the primary transistor Q1 and control the second drive source 22 to stop driving the secondary transistor Q2, when a sampled voltage increases to a first reference voltage;

determining to end the current switching-on cycle when the sampled voltage increases to a second reference voltage, and controlling the first drive source 21 to stop driving the primary transistor Q1; and controlling the first discharge circuit 31 and the second discharge circuit 32 to start discharge when the sampled voltage increases to a third reference voltage, wherein the first reference voltage is equivalent to 20% to 50% of the third reference voltage.

For more information, please refer to the above circuit embodiment, which will not be repeated here. One skilled in the art can understand that all or part of the process of realizing the above embodiment method can be completed by instructing relevant hardware through a computer program. The program can be stored in a computer-readable storage medium. When executing, the program can include the process of the above embodiments. For example, the execution subject of the above method may be the control module 1.

The Darlington transistor drive circuit, Darlington transistor drive method, and switching power supply management chip of the present disclosure has following technical effects. In this embodiment, the Darlington transistor is driven sectionally. At the beginning of the switching-on cycle, the driving of the primary transistor is not started temporarily, instead the drive source is directly used to drive the secondary transistor. After the secondary transistor is completely switched on, the drive source of the secondary transistor is switched off and the drive source of the primary transistor is switched on to drive the whole Darlington transistor, because the primary transistor and the secondary transistor have been completely switched on, and the drive current of the secondary transistor does not depend on the primary transistor, so the voltage at the input terminal of the secondary transistor can be smaller than the voltage at the control terminal of the secondary transistor, so the voltage drop between the input terminal and the output terminal, when the secondary transistor is switched on, does not need to be larger than the base-emitter voltage of the secondary transistor when the secondary transistor is switched on. In such a way, the power loss is reduced when the Darlington transistor is switched on.

The embodiments of the present disclosure are described above in combination with the drawings, but the present disclosure is not limited to the above specific embodiments. The above specific embodiments are only schematic, not restrictive. Ordinary technicians in the art can make many forms under the enlightenment of the present disclosure and without departing from the scope of the purpose and claims of the present disclosure, and these are within the protection of the present disclosure.

The invention claimed is:

1. A Darlington transistor drive circuit configured to drive a Darlington transistor, which comprises a primary transistor and a secondary transistor, to operate alternately in a switching-on cycle and a switching-off cycle; wherein the Darlington transistor drive circuit comprises:
   a first drive source, which is connected with a control terminal of the primary transistor and is configured to provide a drive current to the primary transistor;
   a second drive source, which is connected with a control terminal of the secondary transistor and is configured to provide a drive current to the secondary transistor;
   a control module, which is respectively connected with the first drive source and the second drive source, and is configured to synchronously control the second drive source to start driving the secondary transistor at a beginning of each switching-on cycle, to control the first drive source to start driving the primary transistor after the secondary transistor is completely switched on, and to control the second drive source to stop driving the secondary transistor at a same time when controlling the first drive source to start driving the primary transistor, and to control the first drive source to stop driving the primary transistor when a current switching-on cycle needs to be ended.

2. The Darlington transistor drive circuit according to claim 1, wherein the Darlington transistor drive circuit further comprises a sampling detection circuit, which is respectively connected with an output terminal of the secondary transistor and the control module; wherein the sampling detection circuit is configured to detect a sampled voltage which is generated by an output current of the secondary transistor and to feed back the sampled voltage to the control module;
   wherein the control module is further configured to, in each switching-on cycle:
   firstly control the second drive source to start driving the secondary transistor; synchronously control the first drive source to start driving the primary transistor and control the second drive source to stop driving the secondary transistor, when the sampled voltage increases to a first reference voltage; determine to end the current switching-on cycle when the sampled voltage increases to a second reference voltage, and control the first drive source to stop driving the primary transistor.

3. The Darlington transistor drive circuit according to claim 2, wherein the Darlington transistor drive circuit further comprises:
   a first discharge circuit, which is connected with the control terminal of the primary transistor and is configured to discharge the control terminal of the primary transistor to completely switch off the primary transistor; and
   a second discharge circuit, which is connected with the control terminal of the secondary transistor and is configured to discharge the control terminal of the secondary transistor to completely switch off the secondary transistor;
   wherein the control module is further configured to, in each switching-on cycle:
   synchronously control the first discharge circuit and the second discharge circuit to stop discharge when controlling the second drive source to start driving the secondary transistor; and synchronously control the first discharge circuit and the second discharge circuit to start discharge when the sampled voltage increases to a third reference voltage, wherein the third reference voltage is larger than the second reference voltage.

4. The Darlington transistor drive circuit according to claim 3, wherein the first reference voltage is equivalent to 20% to 50% of the third reference voltage.

5. The Darlington transistor drive circuit according to claim 3, wherein the first discharge circuit comprises a first discharge switch, the second discharge circuit comprises a second discharge switch, wherein the first discharge switch is connected between the control terminal of the primary transistor and ground, the second discharge switch is connected between the control terminal of the secondary transistor and the ground, and control terminals of the first discharge switch and the second discharge switch are connected with the control module.

6. The Darlington transistor drive circuit according to claim 5, wherein the first drive source comprises a first power supply and a first drive switch, the second drive source comprises a second power supply and a second drive switch, wherein the first drive switch is connected between the first power supply and the control terminal of the primary transistor, and the second drive switch is connected between the second power supply and the control terminal of the secondary transistor, control terminals of the first drive switch and the second drive switch are respectively connected with the control module.

7. The Darlington transistor drive circuit according to claim 6, wherein the first drive switch and the second drive switch are MOS tubes.

8. The Darlington transistor drive circuit according to claim 5, wherein the first discharge switch and the second discharge switch are MOS tubes.

9. A switching power supply management chip which comprises a Darlington transistor drive circuit, wherein the Darlington transistor drive circuit is configured to drive a Darlington transistor, which comprises a primary transistor and a secondary transistor, to operate alternately in a switching-on cycle and a switching-off cycle; wherein the Darlington transistor drive circuit specifically comprises:
 a first drive source, which is connected with a control terminal of the primary transistor and is configured to provide a drive current to the primary transistor;
 a second drive source, which is connected with a control terminal of the secondary transistor and is configured to provide a drive current to the secondary transistor;
 a control module, which is respectively connected with the first drive source and the second drive source, and is configured to synchronously control the second drive source to start driving the secondary transistor at a beginning of each switching-on cycle, to control the first drive source to start driving the primary transistor after the secondary transistor is completely switched on, and to control the second drive source to stop driving the secondary transistor at a same time when controlling the first drive source to start driving the primary transistor, and to control the first drive source to stop driving the primary transistor when a current switching-on cycle needs to be ended.

10. The switching power supply management chip according to claim 9, wherein the Darlington transistor drive circuit further comprises a sampling detection circuit, which is respectively connected with an output terminal of the secondary transistor and the control module; wherein the sampling detection circuit is configured to detect a sampled voltage which is generated by an output current of the secondary transistor and to feed back the sampled voltage to the control module;
 wherein the control module is further configured to, in each switching-on cycle: firstly control the second drive source to start driving the secondary transistor; synchronously control the first drive source to start driving the primary transistor and control the second drive source to stop driving the secondary transistor, when the sampled voltage increases to a first reference voltage; determine to end the current switching-on cycle when the sampled voltage increases to a second reference voltage; and control the first drive source to stop driving the primary transistor.

11. The switching power supply management chip according to claim 10, wherein the Darlington transistor drive circuit further comprises:
 a first discharge circuit, which is connected with the control terminal of the primary transistor and is configured to discharge the control terminal of the primary transistor to completely switch off the primary transistor; and
 a second discharge circuit, which is connected with the control terminal of the secondary transistor and is configured to discharge the control terminal of the secondary transistor to completely switch off the secondary transistor;
 wherein the control module is further configured to, in each switching-on cycle, synchronously control the first discharge circuit and the second discharge circuit to stop discharge when controlling the second drive source to start driving the secondary transistor; and synchronously control the first discharge circuit and the second discharge circuit to start discharge when the sampled voltage increases to a third reference voltage, wherein the third reference voltage is larger than the second reference voltage.

12. The switching power supply management chip according to claim 11, wherein the first reference voltage is equivalent to 20% to 50% of the third reference voltage.

13. The switching power supply management chip according to claim 10, wherein the first discharge circuit comprises a first discharge switch, the second discharge circuit comprises a second discharge switch, wherein the first discharge switch is connected between the control terminal of the primary transistor and ground, the second discharge switch is connected between the control terminal of the secondary transistor and the ground, and control terminals of the first discharge switch and the second discharge switch are connected with the control module.

14. The switching power supply management chip according to claim 13, wherein the first drive source comprises a first power supply and a first drive switch, the second drive source comprises a second power supply and a second drive switch, wherein the first drive switch is connected between the first power supply and the control terminal of the primary transistor, and the second drive switch is connected between the second power supply and the control terminal of the secondary transistor, control terminals of the first drive switch and the second drive switch are respectively connected with the control module.

15. The switching power supply management chip according to claim 14, wherein the first drive switch and the second drive switch are MOS tubes.

16. The switching power supply management chip according to claim 13, wherein the first discharge switch and the second discharge switch are MOS tubes.

17. A Darlington transistor drive method applied to a Darlington transistor which comprises a primary transistor and a secondary transistor; wherein the Darlington transistor drive method comprises:
 synchronously controlling a second drive source to start driving the secondary transistor at a beginning of each switching-on cycle;
 controlling a first drive source to start driving the primary transistor after the secondary transistor is completely switched on, and controlling the second drive source to stop driving the secondary transistor at a same time when controlling the first drive source to start driving the primary transistor;
 controlling the first drive source to stop driving the primary transistor when a current switching-on cycle needs to be ended.

18. The Darlington transistor drive method according to claim 17, wherein the method specifically comprises, in each switching-on cycle:
 controlling a first discharge circuit and a second discharge circuit to stop discharge, and synchronously controlling the second drive source to start driving the secondary transistor;
 synchronously control the first drive source to start driving the primary transistor and control the second drive source to stop driving the secondary transistor, when a sampled voltage increases to a first reference voltage;
 determining to end the current switching-on cycle when the sampled voltage increases to a second reference voltage, and controlling the first drive source to stop driving the primary transistor;

controlling the first discharge circuit and the second discharge circuit to start discharge when the sampled voltage increases to a third reference voltage.

19. The Darlington transistor drive method according to claim 18, wherein, wherein the first reference voltage is equivalent to 20% to 50% of the third reference voltage.

\* \* \* \* \*